United States Patent [19]
Carlson

[11] 4,392,022
[45] Jul. 5, 1983

[54] TELEVISION REMOTE CONTROL SYSTEM FOR SELECTIVELY CONTROLLING A PLURALITY OF EXTERNAL APPARATUS

[75] Inventor: David J. Carlson, Indianapolis, Ind.

[73] Assignee: RCA Corporation, New York, N.Y.

[21] Appl. No.: 230,359

[22] Filed: Jan. 30, 1981

[51] Int. Cl.³ .......................................... H04M 11/08
[52] U.S. Cl. ............................. 179/2 TV; 179/2 EA; 358/85; 358/194.1
[58] Field of Search ........... 179/2 TV, 2 EA; 358/85, 358/194.1; 455/344

[56] References Cited

U.S. PATENT DOCUMENTS

| Re. 29,183 | 4/1977 | Greneker | 179/41 A |
|---|---|---|---|
| 3,534,161 | 10/1970 | Friesen et al. | 178/5.6 |
| 4,053,717 | 10/1977 | Snider | 179/41 A |
| 4,266,097 | 5/1981 | Cannon et al. | |
| 4,289,930 | 9/1981 | Connolly et al. | 179/2 TV |
| 4,322,855 | 3/1982 | Mogi et al. | 358/194.1 X |
| 4,338,492 | 7/1982 | Snopko | 179/2 TV |
| 4,349,701 | 9/1982 | Snopko | 179/2 TV |
| 4,356,509 | 10/1982 | Skerlos et al. | 358/85 |

FOREIGN PATENT DOCUMENTS

| 1396981 | 6/1975 | United Kingdom . | |
| 2002995 | 2/1979 | United Kingdom | 179/2 TV |
| 2035017 | 6/1980 | United Kingdom . | |
| 2043399 | 10/1980 | United Kingdom . | |
| 1584111 | 2/1981 | United Kingdom . | |
| 1590617 | 6/1981 | United Kingdom . | |
| 2081948A | 2/1982 | United Kingdom . | |

OTHER PUBLICATIONS

Zenith Radio Corporation System 3 Product Brochure, p. 4, Published May 1980.
Electronic Technician/Dealer Magazine, pp. 19-20, Sep. 1980.
Popular Science Magazine, p. 7, Oct. 1980.
B. Harden, "Teletext/Viewdata LSI", *IEEE Transactions on Consumer Electronics*, vol. CE-25, No. 3, Jul. 1979, pp. 353-358.
J. Hedger, "Telesoftware: Home Computing Via Broadcast Teletext", *IEEE Transactions on Consumer Electronics*, vol. CE-25, No. 3, Jul. 1979, pp. 279-287.
R. D. Bright, "Viewdata—A New Development by the UK Post Office", *National Electronics Review*, vol. 12, No. 1, Jan.-Feb. 1976, pp. 11 & 12.
E. Insam et al., International Broadcasting Convention conference paper, "An Integrated Teletext and Viewdata Receiver", pp. 113-116.

*Primary Examiner*—G. Z. Rubinson
*Assistant Examiner*—Keith E. George
*Attorney, Agent, or Firm*—E. M. Whitacre; P. J. Rasmussen; A. J. Jacobson

[57] ABSTRACT

A remote control system utilizing a portion of a television receiver system to control appliances external to the television receiver. A specific embodiment is shown for controlling a telephone through the television remote control unit. The viewer answers or originates telephone calls by operating the television remote control unit. In an alternate embodiment, the signal carrier from the control unit to the television is modulated in order to transmit voice signals. Further appliances may be controlled through the telephone line or by other connections to the television receiver.

3 Claims, 4 Drawing Figures

TELEVISION REMOTE CONTROL SYSTEM FOR SELECTIVELY CONTROLLING A PLURALITY OF EXTERNAL APPARATUS

FIELD OF THE INVENTION

This invention relates to remote control systems.

BACKGROUND OF THE INVENTION

Many television sets include a remote control system which typically has a keyboard with pushbutton functions for turning the television on and off, for controlling the sound level, and for selecting channels.

SUMMARY OF THE INVENTION

The present invention is directed to the use of a television remote control system to control devices external to the television receiver, for example, to avoid a user having to interrupt viewing a program. In the specific embodiment described, a telephone line is coupled to the television remote control system.

In accordance with one aspect of the present invention to which the specific embodiment is directed, the television remote control system is used to originate telephone calls to telephone stations. Towards such end, the keyboard of the remote control transmitter unit is provided with a pushbutton for placing the telephone line in an "off hook" condition and the pushbuttons normally used for channel selection are then enabled for dialing the desired telephone number. In association with this aspect of the present invention, remote appliances, such as lights, coupled to the remote telephone that has been dialed, may be controlled from the television remote control transmitter unit by entering commands through the keyboard.

In accordance with another aspect of the present invention, a microphone is included in the remote control transmitter unit. The voice signal from the microphone modulates the carrier signal between the remote control transmitter and the remote control receiver unit in the television receiver. The television receiver is provided with demodulator and interface circuits, responsive to the received carrier signal, for applying the voice signal to the telephone line.

In accordance with yet another aspect of the present invention, an earphone is included in the remote control receiver unit. The incoming voice signal from the telephone line is transmitted to the earphone through another remote transmitter unit provided in the television receiver.

DETAILED DESCRIPTION

Figure 1:
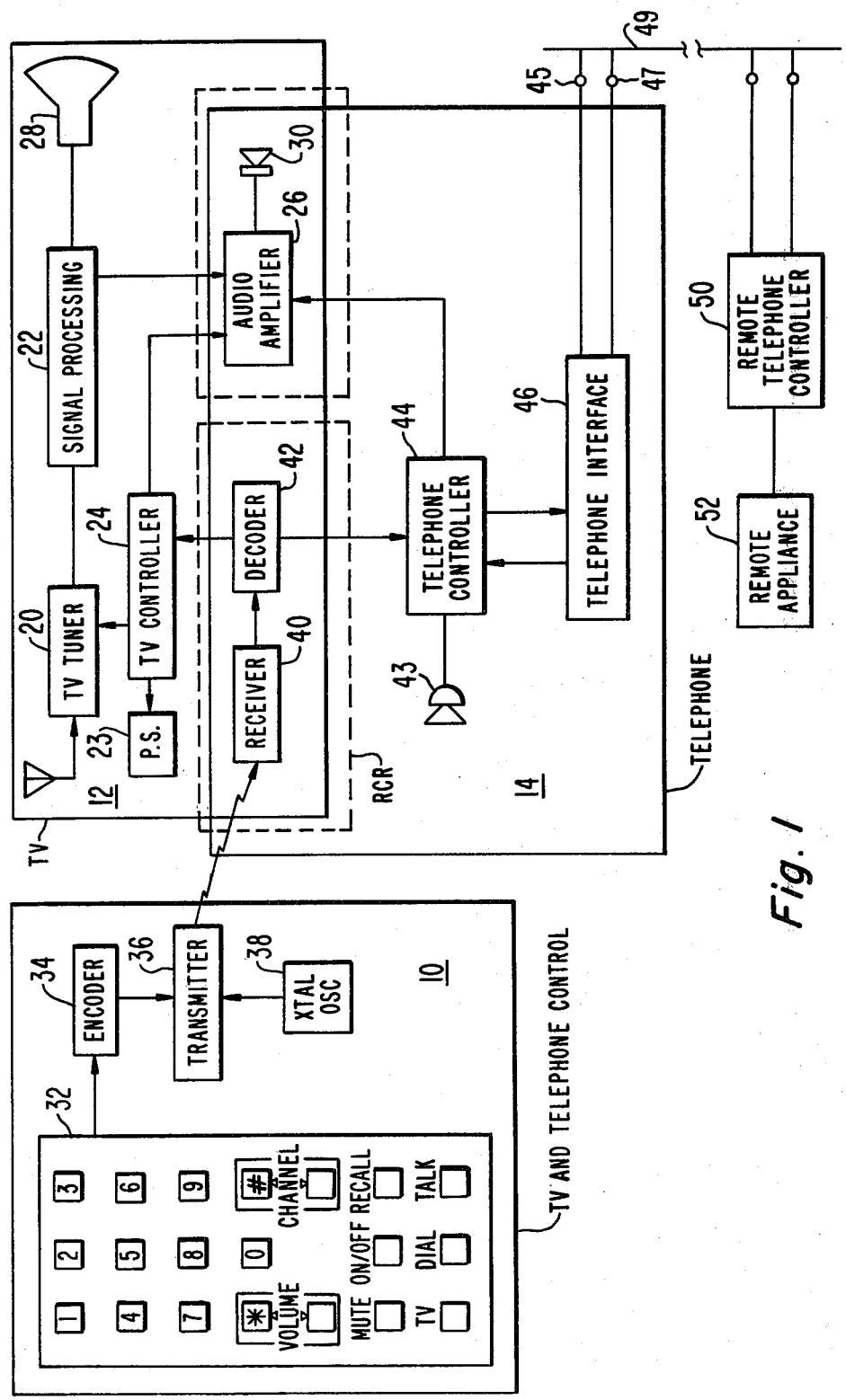
FIGS. 1 and 2 are each block diagrams of respective television remote control systems embodying aspects of the present invention.

FIG. 1 shows an arrangement whereby telephone calls may be placed as well as answered from a television remote control transmitter unit 10. Television remote control transmitter (RCT) unit 10 comprises a keyboard 32 for entering data, an encoder 34 for generating a digitally encoded message in accordance with the data entered, and a transmitter 36 for generating a carrier signal modulated in accordance with the encoded message. A crystal oscillator 38 provides the carrier at a stable reference frequency for transmitter 36. A television remote control unit which uses an infrared (IR) light source as the transmitted carrier signal is described in the "RCA Engineer", published April 1980, pages 34–37, hereby incorporated by reference.

The television receiver includes a TV portion 12 comprising a tuner 20, a picture tube 28, an audio amplifier 26, a speaker 30, signal processing circuits 22, and power supply 23 functioning in conventional manner. The TV portion 12 further includes a remote control receiver (RCR) unit comprising a receiver 40 for receiving the carrier signal from the remote control transmitter unit 10 and extracting the modulating signal and a decoder 42 for decoding the digitally encoded message which is applied to the appropriate portion of TV portion 12 by a television controller 24. Typical television control functions include channel selection by means of television tuner 20, sound level adjustment by means of audio amplifier 26, television on/off control by means of the power supply 23, and "channel number recall" for causing the channel number of the presently selected channel to be displayed within the image produced by picture tube 28.

A telephone link 14 includes a telephone controller 44, a telephone interface 46, and a microphone 43. A telephone line 49 is connected to telephone interface 46. Two lines are connected between telephone interface unit 46 and telephone line 49 through terminals 45 and 47 for coupling the ring and modulated voice signals of a conventional telephone subscriber loop to the telephone link 14. As indicated by the dashed lines, telephone portion 12 and telephone link 14 share as common elements receiver 40 and the decoder 42 of the RCR unit and audio amplifier 26 and the speaker 30.

In operation, the user originates a telephone call by pressing a DIAL button on the keyboard 32. In response, the corresponding digital code representing a DIAL command message modulates the carrier signal transmitted by transmitter 36. Telephone controller 44 receives the decoded DIAL command from decoder 42 and places the telephone line 49 in an off-hook condition. The resulting dial tone is coupled through interface unit 46 to the audio amplifier 26 and thereby to the speaker 30. The user then enters the desired telephone number by operating the appropriate keys of keyboard 32 and corresponding encoded messages are transmitted and decoded. In response, the telephone controller 44 generates standard touch tone signals for each digit of the number dialed. These signals are coupled to telephone line 49 by interface unit 46. For answering incoming telephone calls, a ring signal on telephone line 49 is coupled by interface 46 to telephone controller 44 where it is detected. In response, telephone controller 44 supplies a corresponding signal to audio amplifier 26 and thereby to speaker 30. When the user presses the TALK button, microphone 43 is enabled to pick up room conversation and convert it to an audio signal which is applied by telephone controller 44 and telephone interface 46 as a corresponding voice modulated carrier to telephone line 49. In this mode, audio amplifier 26 and speaker 30 are enabled by telephone controller 44 responsive to voice carriers received from telephone line 49 to produce an audible response.

RCT unit 10 may also be utilized to control remote appliances, indicated by unit 52, such as a lamp. For this purpose a remote telephone controller 50 decodes predetermined numbers coupled to it through telephone line 49 from telephone controller 44 when numerical keys are operated on keyboard 32 after the DIAL key has been operated to produce a corresponding command signal. Each appliance has a predetermined command signal which activates it.

Figure 2:
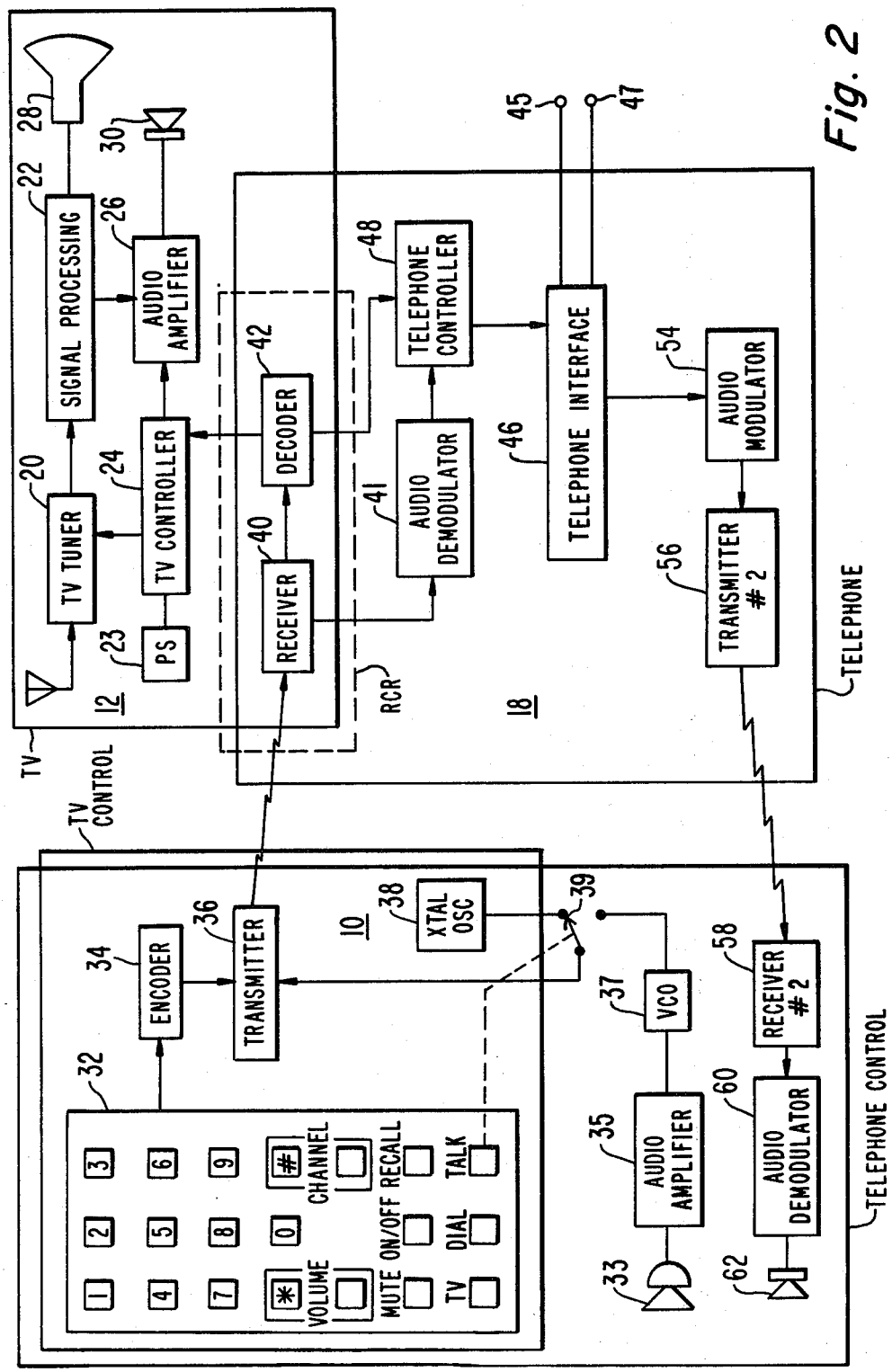

FIG. 2 shows an arrangement wherein the carrier signal transmitted from the remote control transmitter unit is modulated in accordance with the speaker's voice. The voice signal is detected in the telephone link 18 and transmitted to the telephone line. Furthermore, an incoming voice signal from the telephone line is modulated onto another carrier signal transmitted by a transmitter 56 in the television receiver to an earphone 62 in the remote control transmitter whereby a user may have a private telephone conversation by means of the remote control system. Towards the former end, a microphone 33, an audio amplifier 35, a voltage controlled oscillator (VCO) 37, and a push-to-talk switch 39 are added to the remote control unit 10. The switch 39 is mechanically coupled to the TALK button. In order to demodulate the spoken voice from the carrier signal, an audio demodulator 41 is included in telephone portion 18.

In operation, when the TALK button is not pressed, the output from crystal oscillator 38 is connected to transmitter 36 through switch 39. In such position, the remote control unit operates to transmit data entered into the keyboard 32 as described before. When the TALK button is pressed, however, switch 39 connects the output of the VCO 37 to the transmitter 35. The amplitude of the output signal of audio amplifier 35 controls the frequency of VCO 37. Thus the frequency of the carrier signal from transmitter 36 is modulated in accordance with the audio signal from audio amplifier 35. At the television receiver, the frequency modulated (FM) signal is received by receiver 40 and fed to audio demodulator 41 which demodulates the FM signal. The demodulated audio signal is connected through the telephone controller 48 and the telephone interface 46 for transmission to the telephone line.

To transmit voice signals received from telephone line 39 to RCT 10, a second transmitter 56 receives the incoming audio signal from the telephone interface 46 through audio modulator 54. The carrier signal which is transmitted by the second transmitter 56 is received by a second receiver 58 in RCT unit 10. In the RCT unit, an audio demodulator 60 detects the incoming audio signal and drives the earphone 62.

In the embodiment of FIG. 2, the television remote control unit functions as a portable wireless telephone. For convenience, the remote control unit may be generally shaped like the handset of an ordinary telephone and held in a similar manner.

Figure 3:
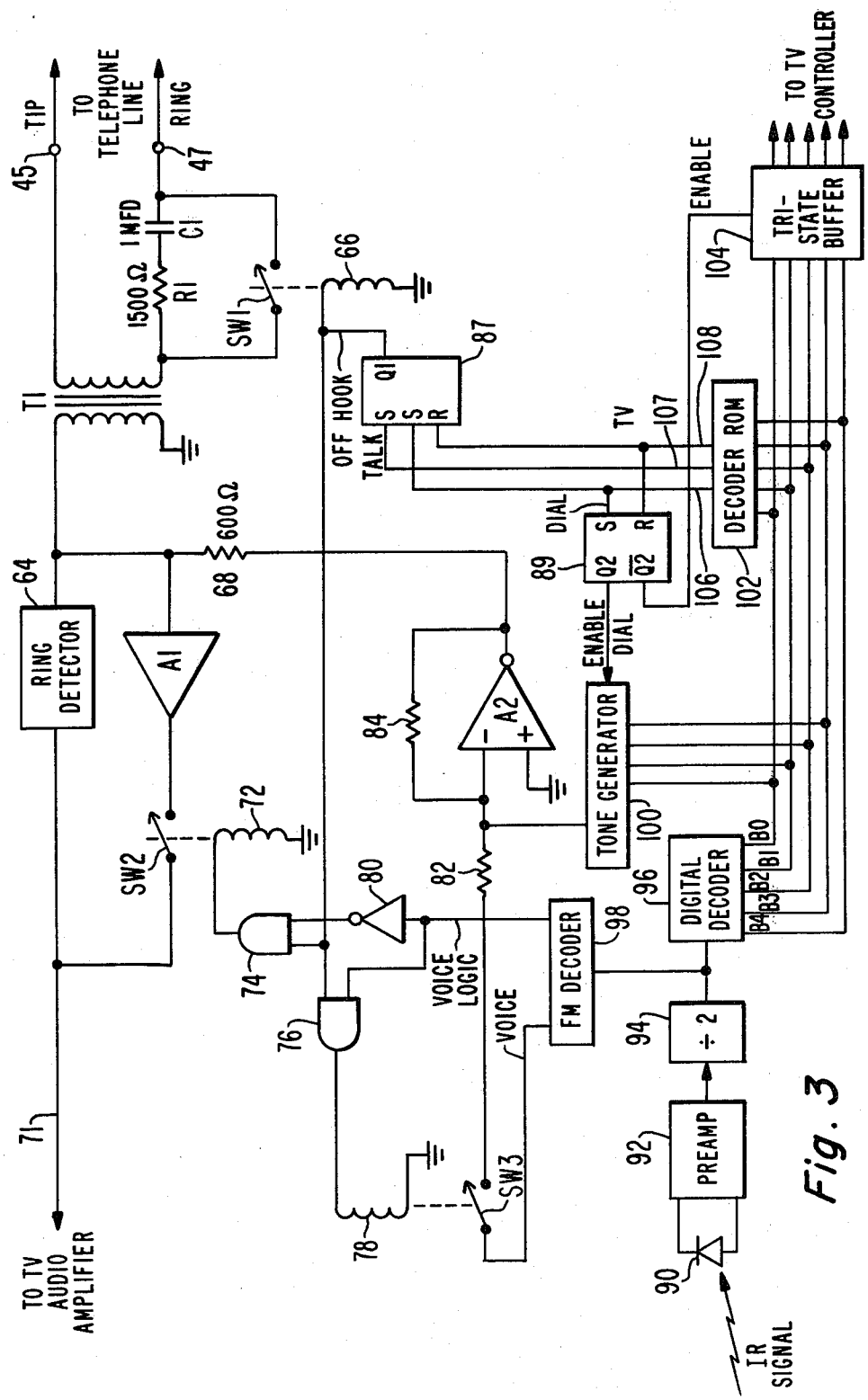
FIG. 3 is a schematic diagram, partially in block form, illustrating details of the telephone interface and telephone controller portions of FIGS. 1 and 2.

Further details of the telephone interface 46 and telephone controller 44 are shown in FIG. 3. The two wires of a conventional telephone line, commonly referred to as the tip and ring lines, are connected to terminals 45 and 47 respectively. The audio amplifier in the television receiver is connected to the television controller through conductor 71 on which audio signals are provided. The telephone interface comprises a 1:1 line transformer T1 for isolating the television system from the telephone line, a ring detector 64 for detecting the presence of a ring signal on the telephone line, an audio amplifier A1 for amplifying the received signal from the telephone line, and an operational amplifier A2 with associated resistors 82 and 84 for amplifying voice signals for transmission to the telephone line. The telephone controller further includes switching logic for controlling incoming and outgoing audio signals. The switching logic includes inverter 80, AND gates 74 and 76, relays 66, 72 and 78, and respective relay switch contacts SW1, SW2, and SW3.

The IR receiving system comprises an IR sensitive diode 90, a preamplifier 92, a divide-by-two frequency divider 94 and a digital decoder 96. The output of the divide-by-two frequency divider 94 is also connected to an FM decoder for detecting the audio signal representing the voice signal transmitted from the remote control unit. The divide-by-two frequency divider 94 is included to provide a signal having a fifty percent duty cycle to the FM decoder 98. The FM decoder 98 further has a VOICE LOGIC output which provides a logical 1 signal output whenever a voice signal is present. The FM decoder 98 may be realized using commercially available integrated circuits such as Type CD 4046 phase locked loop from RCA Corporation. An FM decoding technique, using a phase locked loop is described in RCA Corporation Integrated Circuit Application Note ICAN 6101.

The output of the digital decoder 96 is a data buss for transmitting data bits B0, B1, B2, B3 and B4. Data bits B0 through B4 represent digital codes corresponding to the buttons that are pressed on the keyboard of the remote control unit. The data buss is connected to a tone generator 100. When enabled, the tone generator 100 generates standard touch tone signals used for dialing on the telephone line. The tone generator 100 may be realized using readily available components such as integrated circuit type MC14410 available from Motorola Semiconductor Corporation together with decoding logic responsive to the detected signals on the data buss.

Data bits B0 through B4 are also connected to a decoder ROM 102 which decodes the remote control unit codes corresponding to keyboard buttons DIAL, TV, and TALK for application to the mode control flip-flops 87 and 89. A tri-state buffer 104 further transmits data bits B0 through B4 to the television controller unit 24 (FIGS. 1 and 2) which receives the regular television remote control commands.

In operation, assume that relays 66, 72 and 78 are de-energized. Therefore switches SW1, SW2 and SW3 are open. When switch SW1 is open, resistor R1 and capacitor C1 are in series with the telephone line. The specific values of R1 (1000 ohms) and C1(1MFD) are selected to meet FCC Rules, part 68, on-hook impedance requirements. An incoming 150 volt peak-to-peak ring signal is detected by detector 64 which supplies a suitable tone signal to the television audio amplifier through conductor 71.

The viewer then presses the TALK button, which action is detected by the decoder ROM 102 which generates a logic 1 output on conductor 107, setting flip flop 87. The output of flip flop 87, which provides a logic 1 signal to AND gates 74 and 76, energizes relay 66 thereby closing switch SW1. This action provides a conductive path in parallel with the ring network R1 and C1 which places the telephone in an off-hook condition, thereby answering the incoming telephone call. Prior to answering the call, the viewer may lower the television volume or press the MUTE button on the remote control unit, which eliminates television sound so that the audio portion of the television program does not interfere with the incoming telephone call.

So long as the TALK button is pressed, a frequency modulated IR signal is received by the IR diode 90. When the user speaks, the FM decoder 98 detects the presence of voice modulation and provides a logic 1 output as the VOICE LOGIC signal to inverter 80 and AND gate 76. Relay 78 is energized which closes switch SW3. The audio signal representing the speaker's voice is connected to amplifier A2 through resistor 82. The output of amplifier A2 is connected to transformer T1 through resistor 68. In such manner, the speaker's voice is transmitted through transformer T1 for transmission on the telephone line. Provision for suitable sidetone may be made in the RCT unit 10 or in the telephone link 14 (FIG. 2).

When the user stops speaking, the VOICE LOGIC signal to inverter 80 goes to logic 0. The output of inverter 80 to AND gate 74 goes to logic 1. Relay 72 is thus energized through AND gate 74 and relay 78 is thus de-energized. Switch SW2 therefore closes connecting the output of amplifier A1 to conductor 71. Incoming audio signals from transformer T1 are thus amplified by amplifier A2 and transmitted to the television audio amplifier through switch SW2.

To disconnect the telephone at the end of the conversation, the TV button is pressed. This action is detected by the decoder ROM 102 which generates a logic 1 signal on conductor 108, resetting flip flops 87 and 89. The output of flip flop 87 goes to a logic 0 which de-energizes relay 66 and again places the telephone in an on-hook condition.

The user may also originate telephone calls from the remote control unit by pressing the DIAL button. This action is detected by decoder ROM 102 which generates a logic 1 output on conductor 106 which sets flip flops 87 and 89. The logic 1 output of flip flop 87 places the telephone in an off-hook condition as previously described.

The output Q2 of flip flop 89 is connected to the tone generator 100. When flip flop 89 is set, tone generator 100 is enabled. The complemented output Q2 of flip flop 89 is connected to the tri-state buffer 104. When flip flop 89 is set, tri-state buffer 104 is disabled, thereby disconnecting the data bits B0 through B4 from the television controller. In such manner, the tri-state buffer 104 prevents dialing information from inadvertently changing the television channel.

The user then enters the desired telephone number into the keyboard of the remote control unit. Each time a button is pressed, a digital code corresponding to that button is transmitted on the data buss B0–B4. Tone generator 100 responds to each such digital code on the data buss by transmitting corresponding touch tone signals to the telephone line via amplifier A2, resistor 68 and transformer T1.

Figure 4:
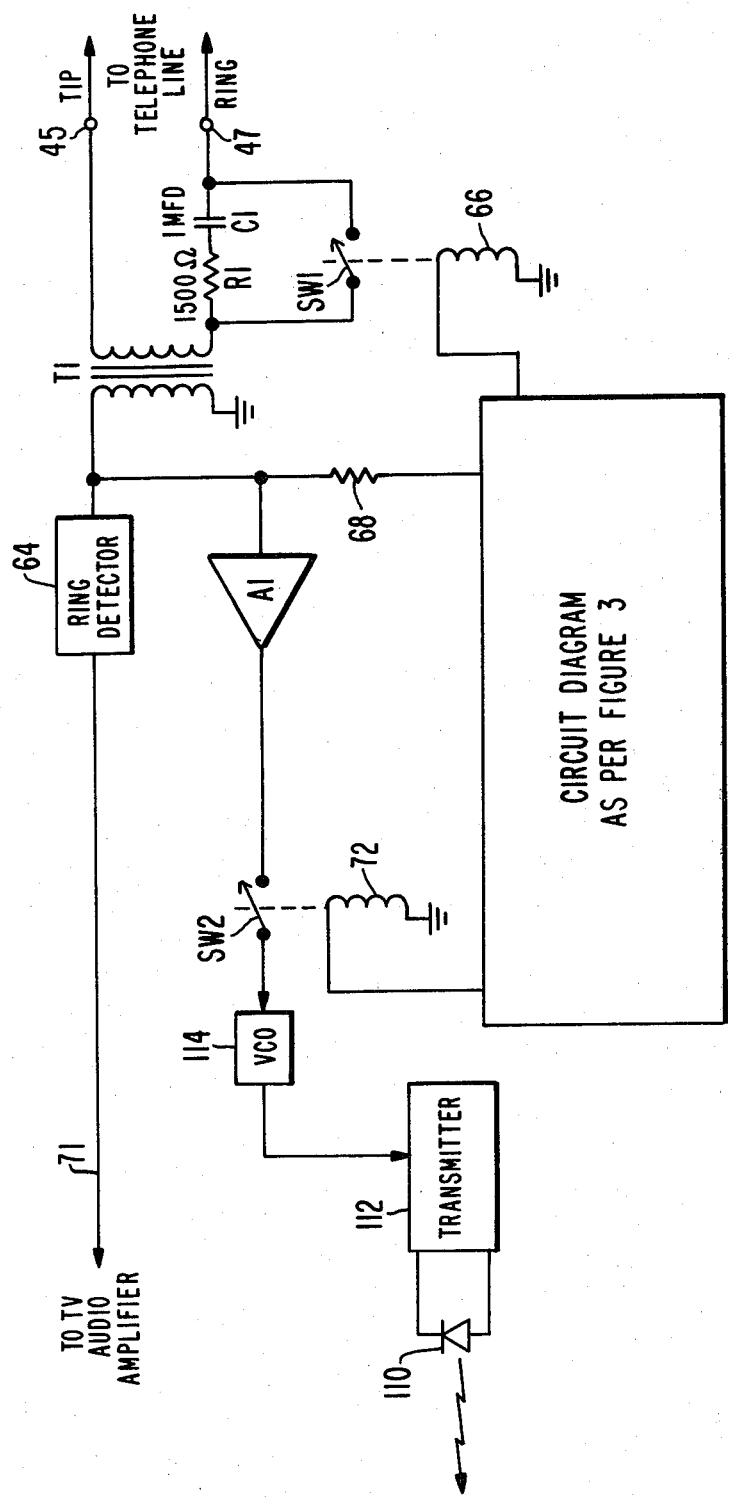
FIG. 4 is a schematic diagram, partially in block form, illustrating further details of the telephone interface and telephone controller portions of FIG. 2.

FIG. 4 illustrates the additional elements required in the television controller 48 for realizing the wireless telephone system of FIG. 2. The output of amplifier A1 is connected through switch SW2 to a voltage controlled oscillator 114. The output of the voltage controlled oscillator 114 is connected to transmitter 112 which drives an IR diode 110. Incoming audio signals from the telephone line are thus buffered by amplifier A1 and frequency modulate the IR carrier signal through voltage controlled oscillator 114 and transmitter 112.

It is noted that relays 66, 72 and 78 and their respective switch contacts SW1, SW2 and SW3 may be solid state switches such as transistors. Furthermore, the carrier signal for transmitting audio signals between the television set and the remote control unit may be other than IR signals. Other embodiments of a telephone system in accordance with the present invention will occur to those skilled in the art. For instance, the voice operated switching system shown may be replaced by a configuration to provide simultaneous two-way operation.

What is claimed is:

1. A television remote control system including a television receiver and a remote control unit comprising:

keyboard means included in said remote control unit for entering data of a first type to control various functions of said television receiver and of a second type corresponding to digits of a telephone number;

encoder means included in said remote control unit for generating a digitally encoded data signal in accordance with said entered data of said first and second types;

a microphone included in said remote control unit for providing an analog audio signal;

first modulator means included in said remote control unit for continuously modulating a carrier signal in accordance with said analog audio signal;

first infrared transmitter means included in said remote control means for transmitting a selected one of said digitally encoded data signal and said continuously modulated carrier signal;

switching means included in said remote control means for selecting said one of said digitally encoded data signal and said continuously modulated carrier signal;

first infrared receiver means included in said television receiver for receiving said selected signal transmitted by said first infrared transmitter means;

decoder means included in said television receiver for decoding said received selected signal corresponding to said digitally encoded data signal to produce first decoded digital signals according to said entered data of said first type and to produce second decoded digital signals according to said entered data of said second type;

television control means included in said television receiver for controlling said various functions of said television receiver in accordance with said entered data of said first type in response to said first decoded digital signals;

telephone control means included in said television receiver for generating telephone dialing signals in accordance with said entered data of said second type in response to said second decoded digital signals;

first demodulator means included in said television receiver and responsive to said received selected signal corresponding to said continuously modulated carrier signal for demodulating said analog audio signals;

telephone interface means included in said television receiver and to which a telephone line is coupled, for applying said telephone dialing signals to said telephone line to dial said telephone number and for applying said demodulated analog audio signals to said telephone line when said telephone number has been dialed;

second modulator means included in said television receiver and coupled to said telephone line by said telephone interface means, for modulating a second carrier signal in accordance with incoming audio signals from said telephone line;

second infrared transmitter means included in said television receiver for transmitting said modulated second carrier signal;

second infrared receiver means included in said remote control unit for receiving said modulated second carrier signal transmitted by said second infrared transmitter means;

second demodulator means included in said remote control unit and responsive to said received modulated second carrier signal for demodulating said incoming audio signals; and sound reproducing means included in said remote control unit for reproducing sounds in accordance with said demodulated incoming audio signals.

2. A system in accordance with claim 1 wherein said television receiver includes a sound reproducing device and wherein said telephone interface means includes means for applying to said sound reproducing device a signal responsive to said incoming audio signal from said telephone line.

3. A system in accordance with claim 1 wherein:
said telephone control means generates external apparatus signals for controlling external apparatus other than said telephone line in response to entered data of a third type entered by said keyboard means and coupled to said telephone control means by said encoder means, said first infrared transmitter means, said first infrared receiver means and said decoder means; and said telephone interface means applies telephone signals responsive to said external apparatus signals to said telephone line to control said external apparatus in accordance with said entered data of said third type.

* * * * *